(12) United States Patent
Xu et al.

(10) Patent No.: US 10,721,029 B2
(45) Date of Patent: Jul. 21, 2020

(54) TECHNIQUES FOR A HYBRID AUTOMATIC REPEAT REQUEST (HARQ) MECHANISM WITH POLAR CODES

(71) Applicant: QUALCOMM Incorporated, San Diego, CA (US)

(72) Inventors: Changlong Xu, Beijing (CN); Jian Li, Beijing (CN); Chao Wei, Beijing (CN); Neng Wang, Lund (SE); Jilei Hou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/091,081

(22) PCT Filed: Mar. 3, 2017

(86) PCT No.: PCT/CN2017/075563
§ 371 (c)(1),
(2) Date: Oct. 3, 2018

(87) PCT Pub. No.: WO2017/193677
PCT Pub. Date: Nov. 16, 2017

(65) Prior Publication Data
US 2019/0123860 A1    Apr. 25, 2019

(30) Foreign Application Priority Data

May 11, 2016   (WO) ................ PCT/CN2016/081656

(51) Int. Cl.
*H04L 1/18*   (2006.01)
*H04L 1/00*   (2006.01)
(Continued)

(52) U.S. Cl.
CPC .......... *H04L 1/1819* (2013.01); *H03M 13/13* (2013.01); *H03M 13/6306* (2013.01); *H04L 1/00* (2013.01);
(Continued)

(58) Field of Classification Search
CPC ....... H04L 1/0025; H04L 1/0071; H04L 1/08; H04L 27/22; H04L 7/10; H04W 88/022; H04W 8/245
See application file for complete search history.

(56) References Cited

U.S. PATENT DOCUMENTS 7,895,506 B2 * 2/2011 Bhora .................. H04L 1/0051
714/794
2008/0294967 A1   11/2008 Tomlinson et al.
(Continued)

FOREIGN PATENT DOCUMENTS

CN    103281166 A    9/2013
CN    103825669 A    5/2014
(Continued)

OTHER PUBLICATIONS

Guo J., et al., "Multi-CRC Polar Codes and Their Applications", IEEE Communications Letters, Feb. 2016, vol. 20, No. 2, pp. 212-215.
(Continued)

*Primary Examiner* — Chandrahas B Patel
(74) *Attorney, Agent, or Firm* — Arent Fox LLP

(57) ABSTRACT

The present disclosure describes a method, an apparatus, and a computer readable medium for hybrid automatic repeat request (HARQ) transmissions. For example, the method may include generating a first codeword for a first information block, wherein the first codeword is a first polar code, and wherein the first information block includes cyclic redundancy check (CRC) bits; transmitting the first code-
(Continued)

word to a receiver; determining that the first polar code is not successfully decoded at the receiver based at least on a first message received from the receiver; generating a second codeword for a second information block, wherein the second codeword is a first enhanced polar code, and wherein the second information block does not include any CRC bits; transmitting the second codeword to the receiver; and determining that the second codeword and the first codeword are successfully decoded at the receiver based at least on a second message received from the receiver.

30 Claims, 9 Drawing Sheets

(51) Int. Cl.
  *H04L 5/00* (2006.01)
  *H03M 13/13* (2006.01)
  *H03M 13/00* (2006.01)

(52) U.S. Cl.
  CPC .......... *H04L 1/0061* (2013.01); *H04L 1/1861* (2013.01); *H04L 5/0048* (2013.01); *H04L 5/0053* (2013.01); *H04L 5/0055* (2013.01); *H04L 5/001* (2013.01)

(56) References Cited

U.S. PATENT DOCUMENTS

| | | |
|---|---|---|
| 2010/0128660 A1 | 5/2010 | Becker et al. |
| 2012/0185755 A1 | 7/2012 | Orlik et al. |
| 2014/0169388 A1 | 6/2014 | Jeong et al. |
| 2015/0358113 A1 | 12/2015 | Callard et al. |
| 2016/0079999 A1 | 3/2016 | Shen et al. |
| 2016/0182187 A1 | 6/2016 | Kim et al. |

FOREIGN PATENT DOCUMENTS

| | | |
|---|---|---|
| CN | 105227189 A | 1/2016 |
| EP | 2922227 A1 | 9/2015 |
| KR | 101496182 B1 | 3/2015 |
| WO | 2015139316 A1 | 9/2015 |
| WO | 2016082142 A1 | 6/2016 |

OTHER PUBLICATIONS

International Search Report and Written Opinion—PCT/CN2016/081656—ISA/EPO—dated Jan. 26, 2017.
International Search Report and Written Opinion—PCT/CN2017/075563—ISA/EPO—dated May 25, 2017.
Li B., et al., "An Adaptive Successive Cancellation List Decoder for Polar Codes with Cyclic Redundancy Check", IEEE Communications Letters, IEEE Service Center, Piscataway, NJ, US, vol. 16, No. 12, Dec. 1, 2012 (Dec. 1, 2012), pp. 2044-2047, XP011478817, ISSN: 1089-7798, DOI:10.1109/LCOMM.2012.111612.121898, Section I, III and IV.
Li B., et al., "Capacity-Achieving Rateless Polar Codes", Aug. 13, 2015 (Aug. 13, 2015), pp. 1-14, XP055449704, DOI: 10.1109/ISIT.2016.7541258, Retrieved from the Internet: URL: https://arxiv.org/pdf/1508.03112.pdf. [retrieved on Feb. 9, 2018], Section 1, 2-4.2.5.
Supplementary European Search Report—EP17795296—Search Authority—The Hague—dated Nov. 26, 2019.

\* cited by examiner

700

710

Generate a first codeword for a first information block

720

Transmit the first codeword to a receiver

730

Determine that the first polar code is not successfully decoded at the receiver based at least on a first message received from the receiver

740

Generate a second codeword for a second information block

750

Transmit the second codeword to the receiver

760

Determine that the second codeword is successfully decoded at the receiver based at least on a second message received from the receiver

FIG. 7

TECHNIQUES FOR A HYBRID AUTOMATIC REPEAT REQUEST (HARQ) MECHANISM WITH POLAR CODES

CLAIM OF PRIORITY

The present application for patent claims priority to PCT International Application No. PCT/CN2017/075563, filed Mar. 3, 2017, entitled "Techniques for a Hybrid Automatic Repeat Request (HARQ) Mechanism with Polar Codes," and PCT International Application No. PCT/CN2016/081656, filed May 11, 2016, entitled "Techniques for a Hybrid Automatic Repeat Request (HARQ) Mechanism with Polar Codes," which is assigned to the assignee hereof, and hereby expressly incorporated by reference in its entirety herein.

BACKGROUND

The present disclosure relates generally to communication systems, and more particularly, to hybrid automatic repeat request (HARQ) mechanism with polar codes.

Wireless communication networks are widely deployed to provide various communication services such as voice, video, packet data, messaging, broadcast, etc. These wireless networks may be multiple-access networks capable of supporting multiple users by sharing the available network resources. Examples of such multiple-access networks include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

These multiple access technologies have been adopted in various telecommunication standards to provide a common protocol that enables different wireless devices to communicate on a municipal, national, regional, and even global level. For example, 5G NR (new radio) communications technology is envisaged to expand and support diverse usage scenarios and applications with respect to current mobile network generations. In an aspect, 5G communications technology includes enhanced mobile broadband addressing human-centric use cases for access to multimedia content, services and data; ultra-reliable-low latency communications (URLLC) with requirements, especially in terms of latency and reliability; and massive machine type communications for a very large number of connected devices, and typically transmitting a relatively low volume of non-delay-sensitive information. However, as the demand for mobile broadband access continues to increase, there exists a need for further improvements in 5G communications technology and beyond. Preferably, these improvements should be applicable to other multi-access technologies and the telecommunication standards that employ these technologies.

In wireless networks, HARQ mechanisms using polar codes that could be efficiently decoded at a receiver are not well defined. As such, a HARQ mechanism that uses polar and/or enhanced polar codes to efficiently decode the polar and/or enhanced polar codes at a receiver is needed to meet the growing demands of wireless networks, e.g., 5G wireless networks.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with an aspect, methods, apparatus, and computer-readable medium relate to hybrid automatic repeat request (HARQ) transmissions. According to one example, a method of HARQ transmission is provided. The method may include generating a first codeword for a first information block, wherein the first codeword is a first polar code, and wherein the first codeword includes CRC bits; transmitting the first codeword to a receiver; determining that the first polar code is not successfully decoded at the receiver based at least on a first message received from the receiver; generating a second codeword for a second information block, wherein the second codeword is a first enhanced polar code, and wherein the second information block does not include any CRC bits; transmitting the second codeword to the receiver; and determining that the second codeword and the first codeword are successfully decoded at the receiver based at least on a second message received from the receiver.

In another example, an apparatus for HARQ transmission is provided. The apparatus includes means for generating a first codeword for a first information block, wherein the first codeword is a first polar code, and wherein the first codeword includes CRC bits; means for transmitting the first codeword to a receiver; means for determining that the first polar code is not successfully decoded at the receiver based at least on a first message received from the receiver; means for generating a second codeword for a second information block, wherein the second codeword is a first enhanced polar code, and wherein the second information block does not include any CRC bits; means for transmitting the second codeword to the receiver; and means for determining that the second codeword and the first codeword are successfully decoded at the receiver based at least on a second message received from the receiver.

In a further example, an apparatus for HARQ transmission is provided. The apparatus includes a memory; and at least one processor coupled to the memory and configured to: generate a first codeword for a first information block, wherein the first codeword is a first polar code, and wherein the first codeword includes CRC bits; transmit the first codeword to a receiver; determine that the first polar code is not successfully decoded at the receiver based at least on a first message received from the receiver; generate a second codeword for a second information block, wherein the second codeword is a first enhanced polar code, and wherein the second information block does not include any CRC bits; transmit the second codeword to the receiver; and determine that the second codeword and the first codeword are successfully decoded at the receiver based at least on a second message received from the receiver.

Additionally, in another example, a computer readable medium storing computer executable code for HARQ transmission is provided. The computer readable medium includes code for generating a first codeword for a first information block, wherein the first codeword is a first polar code, and wherein the first codeword includes CRC bits; code for transmitting the first codeword to a receiver; code for determining that the first polar code is not successfully decoded at the receiver based at least on a first message received from the receiver; code for generating a second codeword for a second information block, wherein the second codeword is a first enhanced polar code, and wherein the second information block does not include any CRC bits; code for transmitting the second codeword to the receiver; and code for determining that the second codeword and the first codeword are successfully decoded at the receiver based at least on a second message received from the receiver.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The accompanying drawings are presented to aid in the description of various aspects of the disclosure and are provided solely for illustration of the aspects and not limitation thereof. The drawings include like reference numbers for like elements, and may represent optional components or actions using dashed lines.

FIG. 7 is a flow diagram of an aspect of a HARQ transmission, which may be executed by HARQ polar code transmission component of FIG. 4.

DETAILED DESCRIPTION

Figure 1:
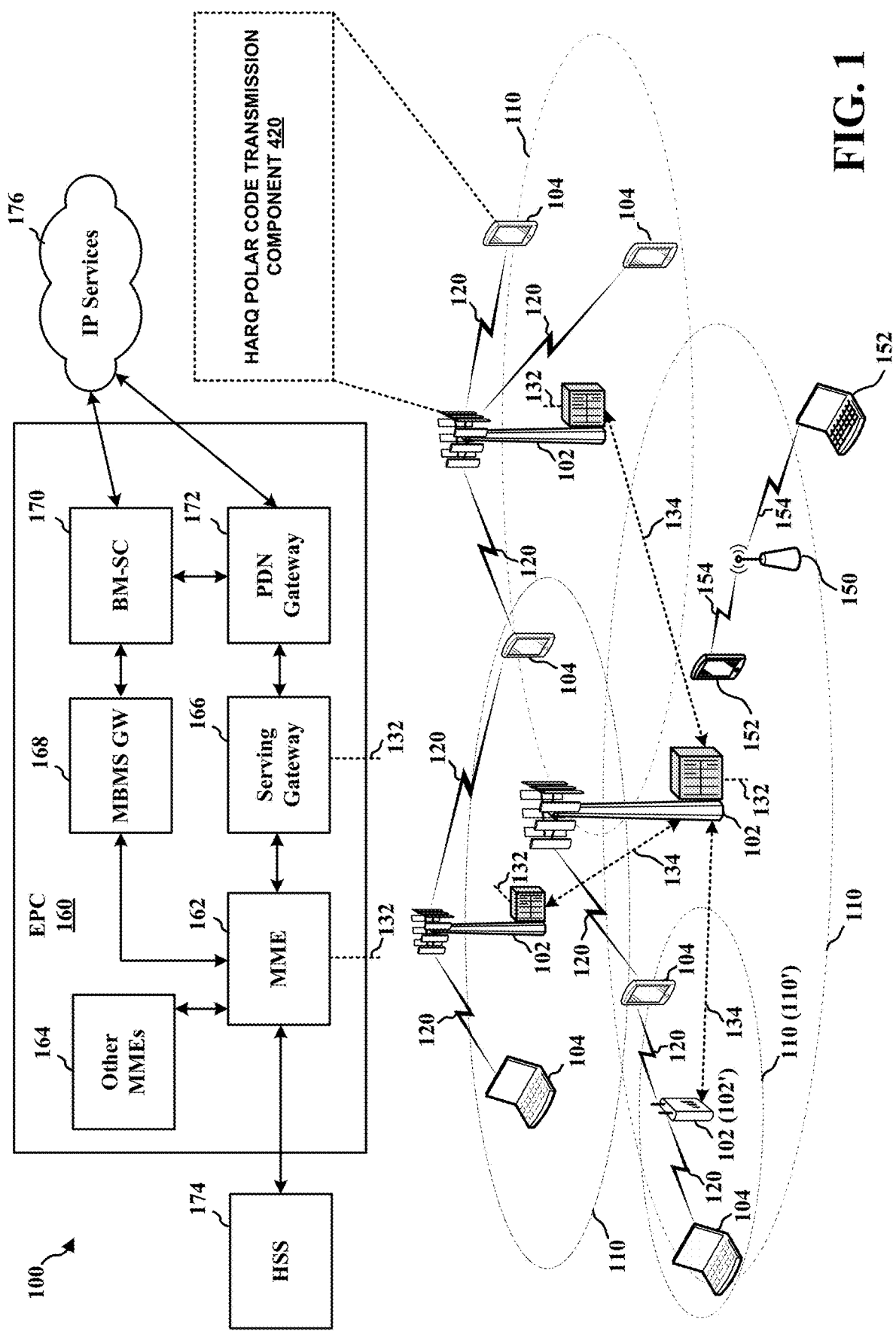
FIG. 1 is a diagram illustrating an example of a wireless communications system and an access network including a base station and/or a user equipment having an aspect of a HARQ polar code transmission component as described herein for HARQ transmission in accordance with various aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example aspects, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

The present disclosure relates to a HARQ transmission from a UE and/or base station. The HARQ transmission uses a combination of polar codes and/or enhanced polar codes for transmitting data from a UE to a base station or from a base station to a UE.

In an aspect, HARQ polar code transmission component 420 at a UE and/or a base station may be configured to generate a codeword, e.g., a first codeword, for a first information block and transmit the first codeword to a receiver. The first codeword may be a polar code, e.g., a first polar code, and the first information block may include cyclic redundancy check (CRC) bits. The HARQ polar code transmission component 420 may receive a message, e.g., a first message, from the receiver in response to the transmission of the first codeword, and may determine that the first polar code is not successfully decoded at the receiver based at least on the first message received from the receiver.

The HARQ polar code transmission component 420 may then generate another codeword, e.g., a second codeword, for a second information block and transmit the second codeword to the receiver. The second codeword is an enhanced polar code, e.g., a first enhanced polar code, and the second information block does not include any CRC bits. The HARQ polar code transmission component 420 may receive a message, e.g., a second message, from the receiver and may determine that the second codeword and the first codeword are successfully decoded at the receiver based at least on a second message received from the receiver.

In an additional aspect, HARQ polar code transmission component 420 may receive a message, e.g., a second message, from the receiver in response to the transmission of the second codeword, and may determine that at least one of the second codeword or the first code is not successfully decoded at the receiver based at least on the second message received from the receiver. The HARQ polar code transmission component 420 may then generate another codeword, e.g., a third codeword, for a third information block and transmit the third codeword to the receiver. The third codeword is another enhanced polar code, e.g., a second enhanced polar code, and the third information block includes portions of the first information block and without any CRC bits. The HARQ polar code transmission component 420 may receive a message, e.g., a third message from the receiver and may determine that the third codeword, the second codeword, and the first codeword are successfully decoded at the receiver based at least on the third message received from the receiver.

FIG. 1 is a diagram illustrating an example of a wireless communications system and an access network 100 including at least one base station 102 and/or UE 104 configured to include a HAQR polar code transmission component 420 for HARQ transmission, in accordance with various aspects of the present disclosure. The wireless communications system 100 (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include eNBs. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved NodeBs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use MIMO antenna technology, including spatial multiplexing, beamforming, and/or transmit diversity. The communication links may be through one or more carriers. The base stations 102/UEs 104 may use spectrum up to Y MHz (e.g., 5, 10, 15, 20 MHz) bandwidth per carrier allocated in a carrier aggregation of up to a total of Yx MHz (x component carriers) used for transmission in each direction. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications system 100 may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ LTE and use the same 5 GHz unlicensed frequency spectrum as used by the Wi-Fi AP 150. The small cell 102', employing LTE in an unlicensed frequency spectrum, may boost coverage to and/or increase capacity of the access network. LTE in an unlicensed spectrum may be referred to as LTE-unlicensed (LTE-U), licensed assisted access (LAA), or MuLTEfire.

The EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 102 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions.

The PDN Gateway 172 and the BM-SC 170 are connected to the IP Services 176. The IP Services 176 may include the Internet, an intranet, an IP Multimedia Subsystem (IMS), a PS Streaming Service (PSS), and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a Node B, an access point, a base transceiver station, a radio base station, a radio transceiver, a transceiver function, a basic service set (BSS), an extended service set (ESS), or some other suitable terminology. The eNB 106 provides an access point to the EPC 160 for a UE 102. Examples of UEs 102 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, or any other similar functioning device. The UE 102 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Figure 2:
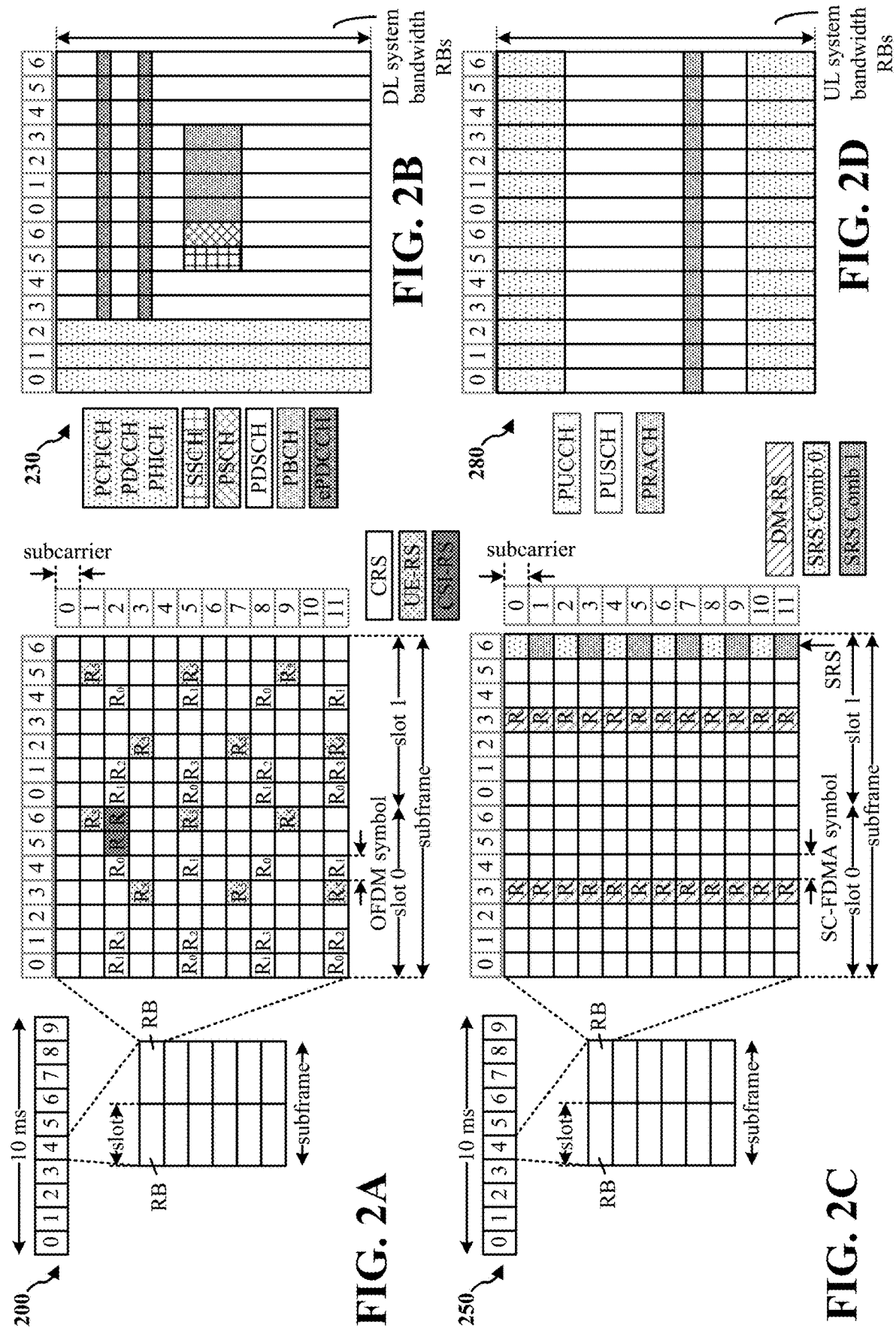
FIGS. 2A, 2B, 2C, and 2D are diagrams illustrating LTE examples of a DL frame structure, DL channels within the DL frame structure, an UL frame structure, and UL channels within the UL frame structure, respectively.

FIG. 2A is a diagram 200 illustrating an example of a DL frame structure in LTE, which may be an example of a frame structure that may be transmitted by at least one base station 102 configured to include HARQ polar code transmission component 420 for transmitting data in accordance with various aspects of the present disclosure. FIG. 2B is a diagram 230 illustrating an example of channels within the DL frame structure in LTE that may be transmitted by base station 102 and used by UE 104 as described herein. FIG. 2C is a diagram 250 illustrating an example of an UL frame structure in LTE, which may be an example of a frame structure that may be transmitted by at least one UE 104 configured to include HARQ polar code transmission component 420 for transmitting data in accordance with various aspects of the present disclosure. FIG. 2D is a diagram 280 illustrating an example of channels within the UL frame structure in LTE that may be used by UE 104. Other wireless communication technologies may have a different frame structure and/or different channels.

In LTE, a frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). In LTE, for a normal cyclic prefix, an RB contains 12 consecutive subcarriers in the frequency domain and 7 consecutive symbols (for DL, OFDM symbols; for UL, SC-FDMA symbols) in the time domain, for a total of 84 REs. For an extended cyclic prefix, an RB contains 12 consecutive subcarriers in the frequency domain and 6 consecutive symbols in the time domain, for a total of 72 REs. The number of bits carried by each RE depends on the modulation scheme. Additionally, the RBs described above may also be referred to as "resources," "orthogonal resources," etc. in the present disclosure.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as $R_0$, $R_1$, $R_2$, and $R_3$, respectively), UE-RS for antenna port 5 (indicated as $R_5$), and CSI-RS for antenna port 15 (indicated as R).

FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (HACK) feedback based on the physical uplink shared channel (PUSCH). The primary synchronization channel (PSCH) is within symbol 6 of slot 0 within subframes 0 and 5 of a frame, and carries a primary synchronization signal (PSS) that is used by a UE to determine subframe timing and a physical layer identity. The secondary synchronization channel (SSCH) is within symbol 5 of slot 0 within subframes 0 and 5 of a frame, and carries a secondary synchronization signal (SSS) that is used by a UE to determine a physical layer cell identity group number. Based on the physical layer identity and the physical layer cell identity group number, the UE can determine a physical cell identifier (PCI). Based on the PCI, the UE can determine the locations of the aforementioned DL-RS. The physical broadcast channel (PBCH) is within symbols 0, 1, 2, 3 of slot 1 of subframe 0 of a frame, and carries a master information block (MIB). The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the eNB. The UE may additionally transmit sounding reference signals (SRS) in the last symbol of a subframe. The SRS may have a comb structure, and a UE may transmit SRS on one of the combs. The SRS may be used by an eNB for channel quality estimation to enable frequency-dependent scheduling on the UL. FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
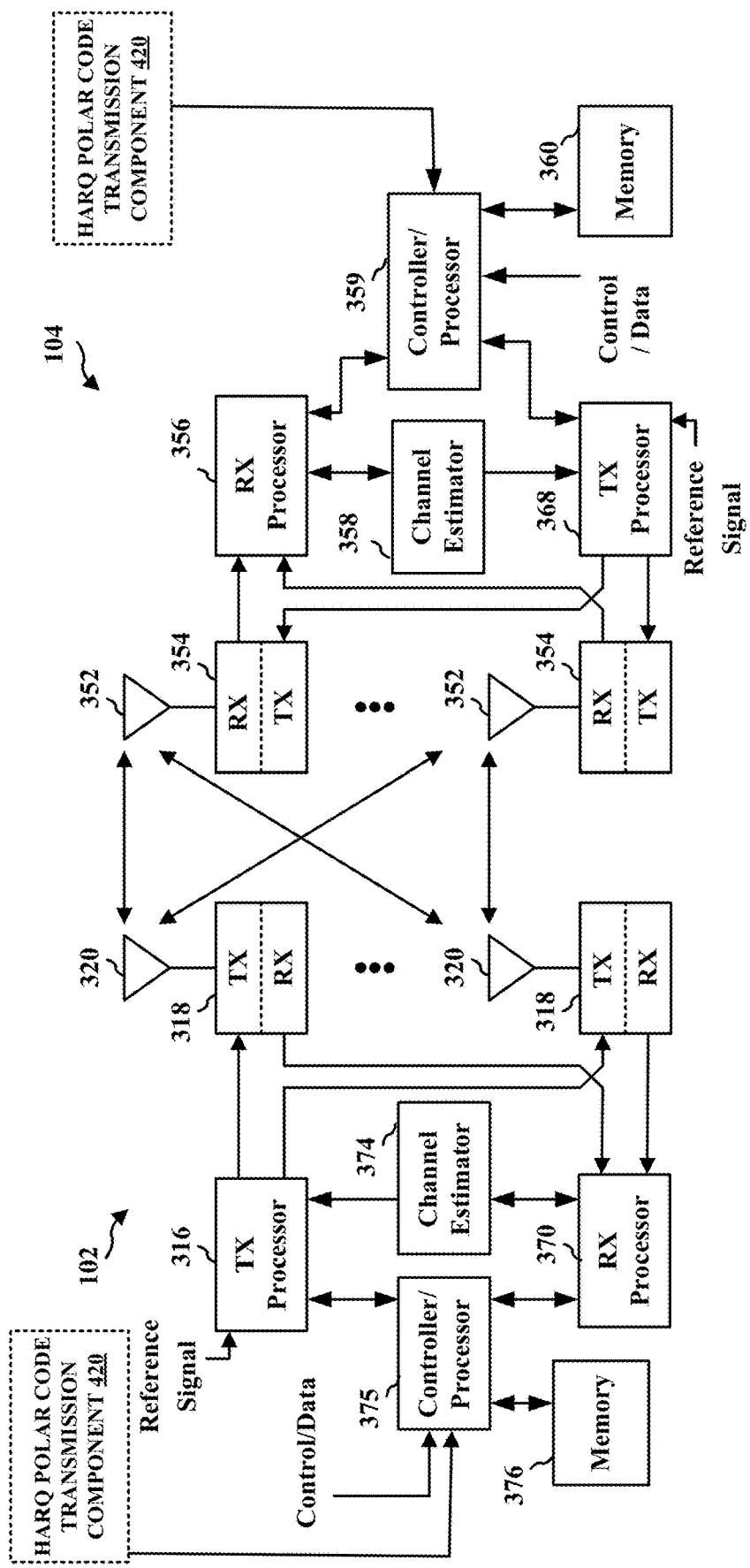
FIG. 3 is a diagram illustrating an example of an evolved Node B (eNB) and/or a user equipment (UE) in an access network, where the eNB and/or the UE includes an aspect of a HARQ polar code transmission component as described herein for HARQ transmission in accordance with various aspects of the present disclosure.

FIG. 3 is a block diagram of an UE 104 in communication with an eNB 102 in an access network. In an aspect, UE 104 and/or base station 102 may be configured to include HARQ polar code component 420. In an aspect, HARQ polar code transmission component 420 may be configured to manage HARQ transmissions. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 104. Each spatial stream may then be provided to a different antenna 320 via a separate transmitter 318TX. Each transmitter 318TX may modulate an RF carrier with a respective spatial stream for transmission.

At the UE 104, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 104. If multiple spatial streams are destined for the UE 104, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the eNB 310. These soft decisions may be based on channel estimates computed by the channel estimator 358. The soft decisions are then decoded and deinterleaved to recover the data and control signals that were originally transmitted by the eNB 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the eNB 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the eNB 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the eNB 310 in a manner similar to that described in connection with the receiver function at the UE 104. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 104. IP packets from the controller/processor 375 may be provided to the EPC 160. The controller/processor 375 is also responsible for error detection using an ACK and/or NACK protocol to support HARQ operations.

Figure 4:
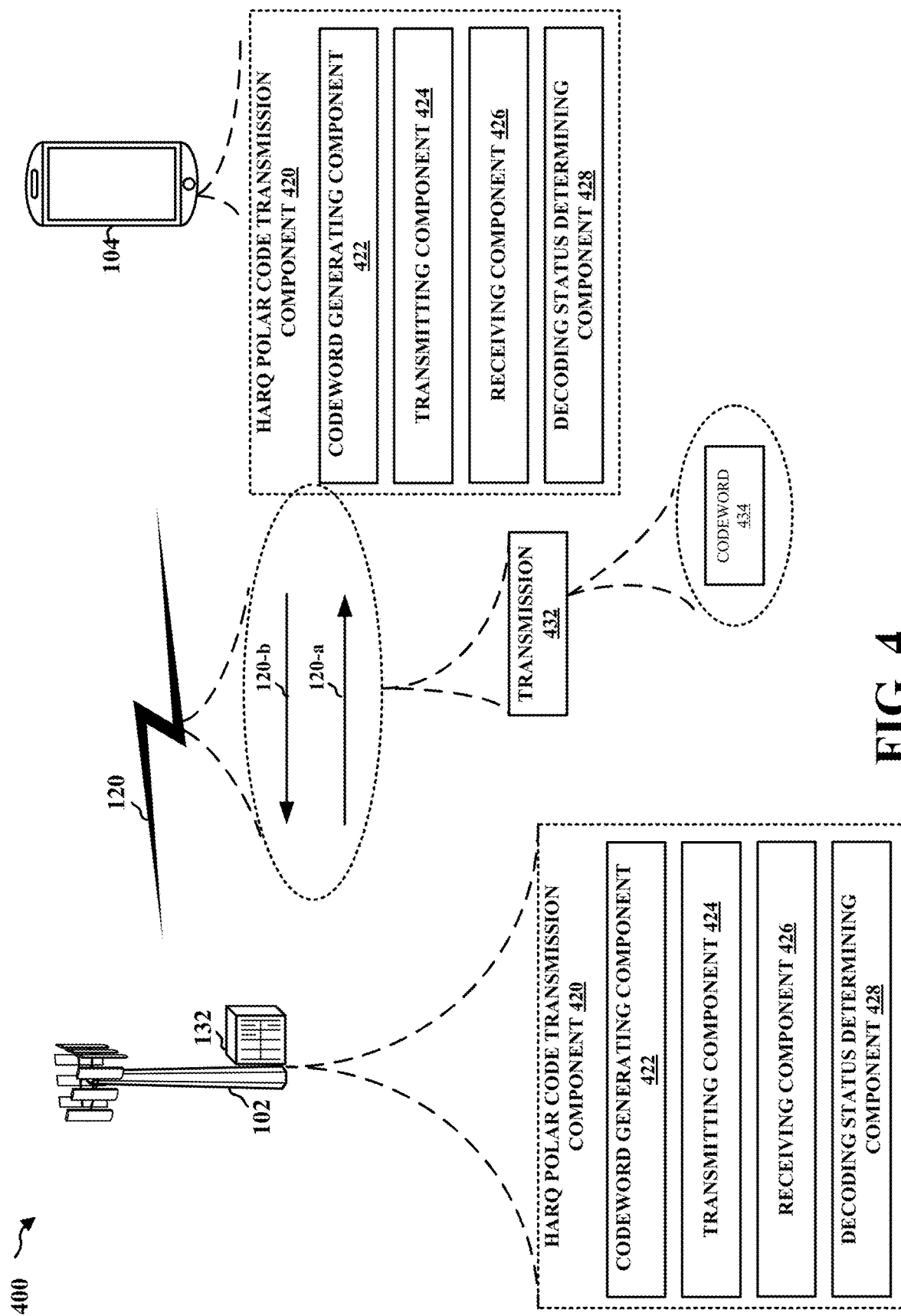
FIG. 4 is a schematic diagram of a wireless communications system including an UE and/or a base station having an aspect of a HARQ polar code transmission component for HARQ transmission in accordance with various aspects of the present disclosure.

Referring to FIG. 4, in an aspect, a wireless communications system 400 (which may be the same as or similar to wireless communications system and an access network 100 of FIG. 1) includes one or more UEs (e.g., UEs 104) in communication coverage of at least one base station 102. The base station 102 (collectively referred to as Evolved Universal Mobile Telecommunications System (UMTS) Terrestrial Radio Access Network (E-UTRAN)) may interface with an EPC (such as EPC 160 of FIG. 1) through backhaul links 132 (e.g., S1 interface). In an aspect, UE 104 and/or base station 102 may include one or more processors (not shown), and optionally, memory (not shown), that may operate in combination with a HARQ polar code transmission component 420 for transmitting data from UE 104 to base station 102 and/or transmitting data from base station 102 to UE 104.

In an aspect, UE 104 may include HARQ polar code transmission component 420 for sending a transmission 432 (e.g., a codeword such as a polar code) on an uplink 120-*b* to base station 102. In an additional aspect, base station 102 may include HARQ polar code component 420 to send a transmission 432 (e.g., a codeword such as a polar code) on an downlink 120-*a* to UE 104. In a HARQ mechanism or scheme, re-transmissions using coded words which may be enhanced polar codes blocks may occur if the first transmission is not decoded correctly at the receiver.

For instance, in an example aspect, HARQ polar code transmission component 420 at a UE and/or a base station may be configured to generate a codeword, e.g., a first codeword, for a first information block and transmit the first codeword to a receiver. The first codeword may be a polar code, e.g., a first polar code, and the first information block may include cyclic redundancy check (CRC) bits. The HARQ polar code transmission component 420 may receive a message, e.g., a first message, from the receiver in response to the transmission of the first codeword, and may determine that the first polar code is not successfully decoded at the receiver based at least on the first message received from the receiver. The HARQ polar code transmission component 420 may then generate another codeword, e.g., a second codeword, for a second information block and transmit the second codeword to the receiver. The second codeword is an enhanced polar code, e.g., a first enhanced polar code, and the second information block does not include any CRC bits. The HARQ polar code transmission component 420 may receive a message, e.g., a second message, from the receiver and may determine that the second codeword and the first codeword are successfully decoded at the receiver based at least on a second message received from the receiver.

Moreover, in an additional example aspect, HARQ polar code transmission component 420 may include a codeword generating component 422, a transmitting component 424, a receiving component 426, and/or a decoding status determining component 428 for performing HARQ transmission. Further, HARQ polar code transmission component 420 and other components (422, 442, 426, and/or 428) may reside at UE 104 and/or base station 102 for HARQ transmission from the UE to the base station and/or from the base station to the UE.

Figure 5:
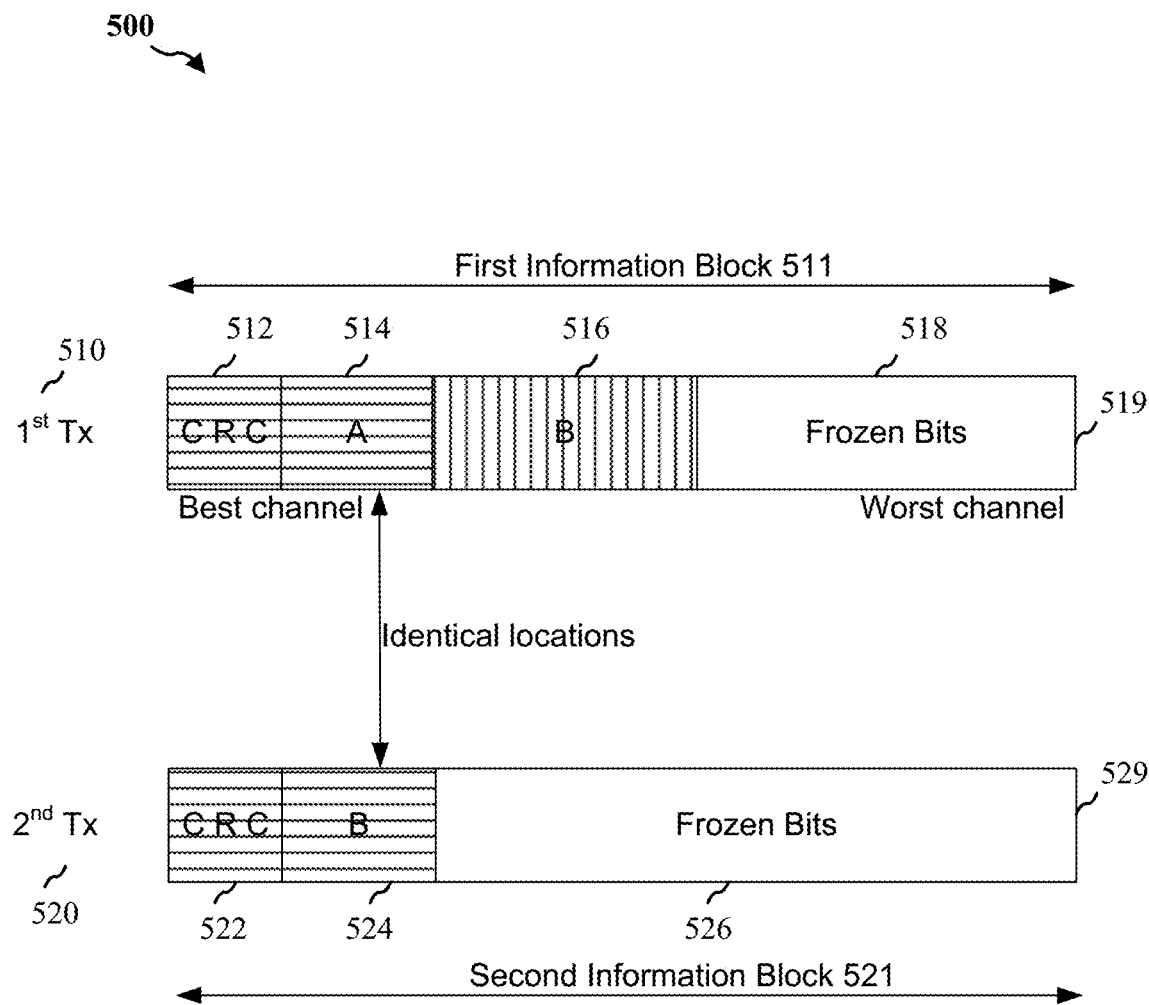
FIG. 5 is a diagram illustrating an example of a HQRQ transmission using polar codes in a wireless communications system.

FIG. 5 is a diagram illustrating a non-limiting example of a HARQ transmission 500 using polar codes.

HARQ mechanism or scheme may be used for transmitting polar codes to achieve high data rates with low latency and may be implemented using incremental redundancy (IR) or chase combining (CC). As the performance of HARQ-IR is generally better than the performance of HARQ-CC, HARQ-IR mechanism is illustrated in FIG. 5. Although, only two transmissions (e.g., a first transmission 510 and a second transmission 520) are illustrated in FIG. 5, in a non-limiting configuration, HARQ mechanism is generally configured for a total of four transmissions (e.g., a first transmission and up to three re-transmissions).

In a HARQ mechanism using polar codes, sub-channels are allocated into two sub-sets: best sub-channels and worst sub-channels (e.g., good and poor quality sub-channels, etc.) based on error probability of each sub-channel. The information bits (e.g., referred to as information bits, data bits for transmission, etc.) are transmitted on the best sub-channels (e.g., sub-channels or channels represented by "best channel" in the left end of the information block) and the frozen bits (e.g., generally zeroes) are transmitted in the worst sub-channels (e.g., sub-channels or channels represented by "worst channel" on the right end of the information block). For example, in an aspect, rows of a Hadamard matrix corresponding to low bit error probabilities of a successive cancellation (SC) decoder may be selected for information bits while the remaining rows may be selected for frozen bits.

In one implementation, UE 104 and/or HARQ polar code transmission component 420 may transmit a first information block 511 to a receiver. The information bits (of the information block) may be transmitted from UE 104 to base station 102 and/or from base station 102 to UE 104. In the example illustrated in FIG. 5, UE 104 may be transmitting to a base station 102. For illustration purposes, first information block 511 may be shown to include CRC bits 512, sub-block A 514, sub-block B 516, and/or frozen bits 518. The first information block 511 may be encoded using polar codes to obtain a codeword 519, e.g., a first codeword 519. That is, information block 511 is encoded to obtain first codeword 519 or first polar code 519 for transmission to the base station.

On the receiving end, the receiver (e.g., base station 102) may decode the first codeword (e.g., codeword 519), for example, using cyclic redundancy check-aided successive cancellation list (CA-SCL) decoding. If the receiver successfully decodes the first codeword 519, the receiver (e.g., base station 102) sends an acknowledgement (ACK) message to UE 104. Upon receiving the ACK message at the UE 104, the transmission of the first information block 511 is considered complete. However, if the receiver (e.g., base station 102) is not able to successfully decode the first codeword 519, UE 104 may receive a negative acknowledge (NACK) message from the receiver, and the UE 104 may attempt a re-transmission (e.g., a second transmission 520).

In a second transmission 520, a second information block 521 may be encoded using a polar code to obtain a second codeword 529 or a second polar code 529. That is, information bits in the second information block 521 may be encoded using polar codes to obtain a new codeword, e.g., a second codeword 529 or a second polar code 529. The second information block 521 may be shown to include CRC bits 522, sub-block B 524, and/or frozen bits 526. Although, second information block 521 is transmitted as one information block (e.g., second transmission 520), it is shown to include CRC bits 522, sub-block B 524, and/or frozen bits 526, etc. to clearly identify and/or distinguish various portions of the information block. The length of the second codeword 529 may be the same size as the first codeword 519. Additionally, the position of sub-block B 524 in the second codeword 529 may be identical to the position of sub-block A 514 in the first codeword 519 to provide better performance at the receiver, e.g., better decoding performance at the receiver.

On the receiving end, the receiver (e.g., base station 102) may decode the second codeword 529, for example, using cyclic redundancy check-aided successive cancellation list (CA-SCL) decoding. If the receiver successfully decodes the second codeword 529, sub-block B 516 of the first codeword 519 may be set (e.g., considered, configured, etc.) as frozen bits (that is, not considered as information bits, ignored, etc.) and the sub-block A 514 of the first transmission 510 may be decoded again after replacing the information bits in the first codeword 519 with the information bits of the second codeword that was successfully decoded. If the receiver successfully decodes the second codeword 529 and the first code word 519, the receiver may send an acknowledgement (ACK) message to UE 104. Upon UE 104 receiving the ACK message from the receiver, the HARQ transmission may be considered complete.

However, if the receiver is not able to successfully decode the first codeword 519 and/or the second codeword 529, UE 104 may receive a negative acknowledge (NACK) message from the receiver, and UE 104 may attempt a re-transmission (e.g., a third transmission, not shown). This may continue until the information is successfully decoded at the receiver and UE 104 receives an ACK message from the receiver indicating successful decoding, depending on the configuration of the HARQ mechanism. For instance, if the receiver cannot successfully decode after the second transmission, a third and/or a fourth transmission may be attempted which may include CRC bits. Generally, a maximum of four transmissions may be attempted. If the receiver is still not successful at decoding, UE 104 may re-start the transmission from the beginning (e.g., sending a new first transmission with a new first codeword, and so on).

In the example of FIG. 5 described above, as the CRC bits are included in every re-transmission and the minimum Hamming distance in polar codes is not guaranteed (e.g., as the rows are selected based on bit error probability only), the decoding performance may be affected resulting in lower transmission rates. Therefore, the present disclosure provides an improved HARQ mechanism or scheme that uses polar codes and/or enhanced polar codes to improve the decoding performance at the receiver.

Figure 6:
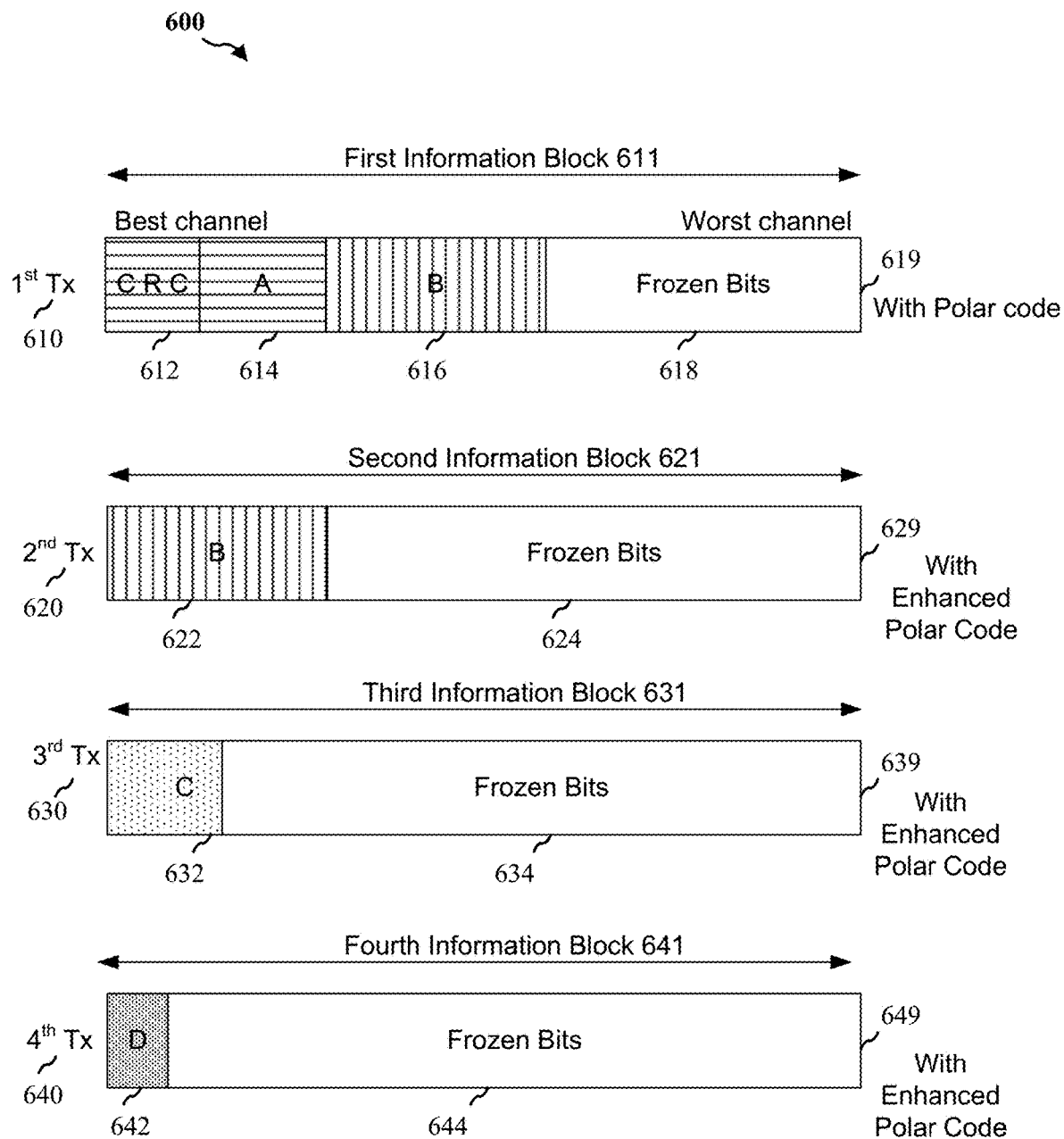
FIG. 6 is a diagram illustrating an example aspect of a HARQ transmission using polar and/or enhanced polar codes in a wireless communications system in accordance with various aspects of the present disclosure.

FIG. 6 is a diagram illustrating a non-limiting example of a HARQ transmission 600 using polar and/or enhanced polar codes, in an aspect of the present disclosure.

As described above in reference to FIG. 5, rows of a Hadamard matrix corresponding to low bit error probabilities of a successive cancellation (SC) decoder may be selected for information bits while the remaining rows may be selected for frozen bits. This may cause issues when decoding at the receiver as the minimum Hamming distance is not guaranteed (e.g., not reliable) since the rows are selected based only on bit error probability. However, in Reed-Muller codes, the rows of generator matrices are selected according to the largest weight. Therefore, the minimum Hamming distances of the constructed codes may be always maintained. To take advantage of the Reed-Muller codes, it is possible to select the rows for polar codes by considering both the bit error probability and minimum Hamming distance, referred to as "enhanced" polar codes. In an aspect, for example, the rows corresponding to the least bit error probabilities may be selected from the row set in which each row has minimum distance as large as possible, and may be used in a HARQ mechanism.

The information bits may be transmitted from UE 104 to base station 102 and/or from base station 102 to UE 104. For example, in an aspect, UE 104 and/or HARQ polar code transmission component 420 may transmit a first information block 611 to a receiver (e.g., base station 102. For illustration purposes, first information block 611 may be shown to include CRC bits 612, sub-block A 614, sub-block B 616, and/or frozen bits 618. The first information block 611 may be encoded using polar codes to obtain a codeword 619, e.g., a first codeword 619. That is, information block is encoded to obtain a first codeword 619 for transmission to the base station 102.

On the receiving end, the receiver (e.g., base station 102) may try to decode the first codeword 619, for example, using cyclic redundancy check-aided successive cancellation list (CA-SCL) decoding. If the receiver successfully decodes the first codeword 619, the receiver sends an acknowledgement (ACK) message to UE 104. Upon the UE 104 receiving the ACK message from the receiver, the transmission may be considered complete. However, if the receiver is not able to successfully decode the first codeword 619, UE 104 may receive a negative acknowledge (NACK) message from the receiver, and UE 104 may attempt a re-transmission (e.g., a second transmission 620).

In a second transmission 620, a second information block 621 encoded as a second codeword 629, e.g., a first enhanced polar code 629, is shown to include sub-block B 622 and frozen bits 624. Although, second information block 621 is transmitted as one information block, they are shown to separately include sub-block B 622 and frozen bits 624, etc. to clearly identify and/or distinguish various portions of the information block and/or transmissions. It should be noted that second codeword 629 is different from first codeword 619. Additionally, second codeword 629 is an enhanced polar code, e.g., first enhanced polar code 629, instead of a polar code used that is used for obtaining the first codeword 619 of FIG. 6 or for the first codeword 519 and/or the second codeword 529 of FIG. 6.

Further, the size of sub-block B 622 of second information block 621 may be smaller than the size of the information bits transmitted in the first transmission 610, e.g., combined size of 612, 614, and 616 or combined size of 614 and 616 of first information block 611. That is, the size of the information bits re-transmitted in sub-block B 622 of second information block 621 may be smaller than the size of information bits transmitted in first information block 611. In an additional aspect, the size of the sub-block B 622 of second information block 621 may be half the combined size of sub-blocks 612, 614, and 616 or half the combined size of sub-blocks 614 and 616 of the first information block 611. Furthermore, no CRC bits are included in the second transmission 620. That is, no CRC bits are included in the second codeword 629 resulting in reduced overhead associated with the second transmission.

On the receiving end, the receiver (e.g., base station 102) may decode the second codeword 629. For example, a SCL decoding mechanism may be used to decode the second codeword 629 or the first enhanced polar code 629. Upon successful decoding of second codeword 629, the information bits in sub-block B 622 of second transmission 620 may be used to replace information bits in sub-block B 616 of first transmission 610 (or first codeword 619). After the replacement of the information bits, the first codeword 619 of the first transmission 610 is decoded again using CA-SCL decoding with the bits in sub-block B 616 of the first transmission being considered as frozen bits (e.g., not relevant, ignored, etc.). Upon successful decoding of first codeword 619 and the second codeword 629, the receiver may send an ACK message to UE 104. Upon UE 104 receiving the ACK message from the receiver, the HARQ transmission may be considered complete. However, if the receiver is not able to successfully decode the second codeword 629 or the first codeword 619, UE 104 may receive a NACK message from the receiver, and the UE 104 may attempt a re-transmission by sending another transmission, e.g., a third transmission 630.

In a third transmission 630, a third information block 631 encoded as a third codeword 639, a second enhanced polar code 639, is shown to include sub-block C 632 and frozen bits 634. Although, third information block 631 is transmitted as one information block 631 or enhanced polar code 639, they are shown to separately include sub-block C 632 and frozen bits 634, etc. to clearly identify and/or distinguish various portions of the information block and/or transmissions. It should be noted that the third codeword 639 is different from first codeword 619 and/or second codeword 629. Additionally, the third codeword 639 is an enhanced polar code. Further, the size of sub-block C 632 of third information block 631 is smaller than the size of the sub-block B 622 of the second information block 621. That is, the size of the information bits re-transmitted in sub-block C 632 of the third information block 631 may be smaller than the size of the information bits transmitted in the sub-block B 622 of the second transmission 620. In an additional aspect, the size of the sub-block C 632 of the third information block 631 may be half the size of sub-block B 622 of the second information block 621 or one fourth the combined size of sub-blocks 612, 614, and 616 of the first information block 611 (or the combined size of sub-blocks of 614 and 616 of the first information block 611). Furthermore, no CRC bits are included in the third transmission resulting in reduced overhead associated with the third transmission 630.

On the receiving end, the receiver (e.g., base station 102) may decode the third codeword 639 or the second enhanced polar code 639. A SCL decoding mechanism may be used to decode the third codeword 639 or the second enhanced polar code 639. If the third codeword 639 is successfully decoded at the receiver, the corresponding information bits in the previous transmissions, e.g., the first code word 619 and/or the second codeword 629 may be replaced. For example, the second codeword 629 with some known bits in the decoded third codeword 639 may be decoded again using SCL. Upon successful decoding of the second codeword 629 using the replaced bits from the decoded third codeword 639, the information bits in sub-block B 622 of decoded second transmission 620 may be used to replace information bits in sub-block B 616 of the first transmission 610 and the bits in sub-block B 616 of first transmission 610 are considered are frozen bits (e.g., not relevant, ignored, etc.). Then the first codeword 619 with some known bits in the decoded second codeword 629 is decoded again using CA-SCL decoding mechanism.

Upon successful decoding of the first codeword 619 at the receiver using the replaced bits from the decoded second codeword 629 (for instance, which may be possible upon successful decoding of the third codeword 639 and the second codeword 629), the receiver may send an acknowledgement (ACK) message to UE 104. Upon the UE 104 receiving the ACK message, the transmission may be considered complete. However, if the receiver is not able to successfully decode the third codeword 639, the second codeword 629, and/or the first codeword 619 (that is, at least one of the three codewords), the UE 104 may receive a NACK message from the receiver, and the UE 104 may attempt a re-transmission by sending another transmission, e.g., a fourth transmission 640.

In a fourth transmission 640, a fourth information block 641 encoded as a fourth codeword 649 (e.g., a third enhanced polar code) may be shown to include sub-block D 642 and frozen bits 644. Although, fourth information block 641 is transmitted as one information block (e.g., fourth transmission 640), they are shown to separately include sub-block D 642 and frozen bits 644, etc. to clearly identify and/or distinguish various portions of the information block and/or transmissions. It should be noted that the fourth codeword 649 is different from the three previous codewords (e.g., first codeword 619, second codeword 629, and/or third codeword 639). Additionally, fourth codeword 649 is an enhanced polar code. Further, the size of the sub-block D 642 of fourth information block 641 is smaller than the size of sub-block C 632 of the third information block 631. That is, the size of the information bits re-transmitted in the sub-block D 642 of the fourth information block 641 may be smaller than the size of the information bits transmitted in the sub-block C 632 of the third transmission 630. In an additional aspect, the size of the sub-block D 642 of the fourth information block 641 may be half the size of the sub-block C 632 of the third information block 630 or one fourth the size of the sub-block B 622 of the second information block 620. Further, no CRC bits are included in the fourth transmission which may reduce the overhead associated with the fourth transmission 640.

On the receiving end, the receiver may decode the fourth codeword, e.g., fourth codeword 649. A SCL decoding mechanism may be used to decode fourth codeword 649, e.g., the third enhanced polar code 649. If the fourth codeword 649 is successfully decoded, the corresponding information bits in the previous transmissions (i.e., third transmission 630, the second transmission 620, and/or the first transmission 610; or the third codeword 639, the second codeword 620 and/or the first codeword 619) may be replaced. For instance, the third codeword 639 with some known information bits (e.g., based on the successful decoding of the fourth codeword 649) may be decoded again using SCL. Upon successful decoding of the third codeword 639, the corresponding information bits in the previous transmissions (e.g., the second codeword 629 and/or the first codeword 69) may be replaced. That is, the second codeword 620 with some known information bits (based on the successful decoding of codewords 639 and 649) may be decoded again using SCL. Upon successful decoding of the second codeword 629, the information bits of sub-block B 622 of the second transmission 620 may be used to replace the information bits in the sub-block 616 of the first transmission and the bits in sub-block B 616 of first information block 610 may be considered as frozen bits (e.g., not relevant, ignored, etc.). The first codeword 619 with known bits in sub-block B is decoded again using CA-SCL.

Upon successful decoding of the first codeword 619 (that is, first codeword with bit replacements as described above) at the receiver, the receiver may send an ACK message to UE 104. Upon the UE 104 receiving the ACK message, the transmission may be considered complete. However, if the receiver is not able to successfully decode the fourth codeword 649, third codeword 639, the second codeword 620, and/or the first codeword 619 (that is, at least one of the four codewords), the UE 104 may receive a NACK message from the receiver, and UE 104 may terminate the re-transmission, and start with a fresh or new first transmission, based on the number of transmissions allowed in a HARQ scheme configured at the UE 104 and/or the base station 102.

The use of a polar code for the $1^{st}$ transmission and enhanced polar codes for the successive transmissions (e.g., $2^{nd}$, $3^{rd}$, and/or $4^{th}$ transmissions) may reduce the overhead associated with the re-transmissions (e.g., $2^{nd}$, $3^{rd}$, and $4^{th}$ transmissions) as there no CRC bits are included in the re-transmissions. Further, the use of enhanced polar codes for $2^{nd}$, $3^{rd}$, and $4^{th}$ transmissions may provide for better performance using SCL decoding as enhanced polar codes have larger minimum hamming distances. Furthermore, when compared to HARQ-IR with CRC in each transmission and retransmissions, the performance gain may be higher when a larger number of retransmissions are needed because the ratio of CRC bits over information bits may become higher. As such, a HARQ mechanism using enhanced polar codes may be implemented to achieve higher data rates with lower latency and improve the decoding performance at the receiver.

FIG. 7 is a flow diagram 700 of an aspect of a HARQ transmission, which may be executed by HARQ polar code transmission component 420 of FIG. 4. Referring to FIG. 7, an UE 104 and/or base station 102 of FIGS. 1 and 4 may include one or more processors to perform an aspect of a method 700 for HARQ transmission. While, for purposes of simplicity of explanation, the method is shown and described as a series of acts, it is to be understood and appreciated that the method is not limited by the order of acts, as some acts may, in accordance with one or more embodiments, occur in different orders and/or concurrently with other acts from that shown and described herein. For example, it is to be appreciated that a method could alternatively be represented as a series of interrelated states or events, such as in a state diagram. Moreover, not all illustrated acts may be required to implement a method in accordance with one or more features described herein.

In an aspect, at block 710, the method 700 may include generating a first codeword for a first information block, wherein the first codeword is a first polar code, and wherein the first information block includes cyclic redundancy check (CRC) bits. For example, in an aspect, UE 104 (and/or base station 102) and/or HARQ polar code transmission component 420 may include a codeword generating component 422, such as a specially programmed processor module, or a processor executing specially programmed code stored in a memory, to generate a first codeword 619 or a first polar code 619 for a first information block 611 which may include CRC bits 612. For instance, the first polar code 619 may be generated for transmitting the first information block 611 which may include the CRC bits 612 for detecting errors. As described above in reference to FIG. 6, the first information block 611, which may include the CRC bits 612, information bits 614 and 616, and/or frozen bits 618, is encoded to obtain the first polar code 619 or the first codeword 619 for transmission to the receiver. In other words, the information block 611 is encoded to generate the first codeword 619 or the first polar code 619 for transmitting to the receiver.

In an aspect, at block 720, the method 700 may include transmitting the first codeword to a receiver. For example, in an aspect, UE 104 (and/or base station 102) and/or HARQ polar code transmission component 420 may include a transmitting component 424, such as a specially programmed processor module, or a processor executing specially programmed code stored in a memory, to transmit the first codeword 619 to the receiver (e.g., base station 102 if UE 104 is the transmitter and/or UE 104, if base station 102 is the transmitter).

In an aspect, at block 730, the method 700 may include determining that the first polar code is not successfully decoded at the receiver based at least on a first message received from the receiver. For example, in an aspect, UE 104 (and/or base station 102) and/or HARQ polar code transmission component 420 may include a decoding status determining component 428, such as a specially programmed processor module, or a processor executing specially programmed code stored in a memory, to determine that the first polar code 619 is not successfully decoded at the receiver based at least on a first message (e.g., an ACK or a NACK message) received from the receiver. For instance, the first message received from the receiver by the receiving component 426 may be an ACK or a NACK message. In an aspect, for example, UE 104 may receive an ACK message from the receiver if the receiver was able to successfully decode the first codeword 619 or UE 104 may receive a NACK message from the receiver if the receiver was not able to successfully decode the first codeword. As such, UE 104 may determine if the decoding is successful at the receiver based at least on the ACK/NACK message received from the receiver.

In an aspect, at block 740, the method 700 may include generating a second codeword for a second information block, wherein the second codeword is a first enhanced polar code, and wherein the second information block does not include any CRC bits. For example, in an aspect, UE 104 (and/or base station 102) and/or HARQ polar code transmission component 420 may include the codeword generating component 422, such as a specially programmed processor module, or a processor executing specially programmed code stored in a memory, to generate a second codeword (e.g., codeword 629) for a second information block 621, wherein the second codeword 629 is a first enhanced polar code, and wherein the second information block does not include any CRC bits. That is, an enhanced polar code is used as a codeword which does not include any CRC bits for generating the second codeword 629.

In an aspect, at block 750, the method 700 may include transmitting the second codeword to the receiver. For example, in an aspect, UE 104 (and/or base station 102) and/or HARQ polar code transmission component 420 may include the transmitting component 424, such as a specially programmed processor module, or a processor executing specially programmed code stored in a memory, to transmit the second codeword 629 to the receiver. As described above in reference to FIG. 6, the second information block 621 which does not include any CRC bits is encoded to obtain the second codeword 629 which is a first enhanced polar code for transmission to the receiver. In other words, the information block 621 is encoded to generate the second codeword 629 for transmitting to the receiver.

In an aspect, at block 760, the method 700 may include determining that the second codeword is successfully decoded at the receiver based at least on a second message received from the receiver. For example, in an aspect, UE 104 (and/or base station 102) and/or HARQ polar code transmission component 420 may include the decoding status determining component 428, such as a specially programmed processor module, or a processor executing specially programmed code stored in a memory, to determine that the second codeword 629 is successfully decoded at the receiver based at least on a second message (e.g., ACK message) received from the receiver.

In an additional aspect, method 700 may optionally include UE 104 (and/or base station 102) and/or HARQ polar code transmission component 420 determining that the second codeword 629 is not successfully decoded at the receiver based at least on the second message received from the receiver. The method 700, optionally, may further include generating a third codeword 639 for a third information block 631, wherein the third codeword 639 is a second enhanced polar code 639, and wherein the third information block 631 includes portions of the first information block and without any CRC bits, transmitting the third codeword 639 to the receiver, and determining that the third codeword 639 is successfully decoded at the receiver based at least on a third message received from the receiver.

In a further additional aspect, method 700 may optionally include determining that the third codeword 639 is not successfully decoded at the receiver based at least on the third message received from the receiver. The method 700, optionally, may further include generating a fourth codeword 649 for a fourth information block 641, wherein the fourth codeword 649 is a third enhanced polar code, and wherein the fourth information block 641 includes portions of the first information block and without any CRC bits, transmitting the fourth codeword 649 to the receiver, and determining that the third codeword 639 is successfully decoded at the receiver based at least on a fourth message received from the receiver.

The HARQ mechanism described above using polar codes and/or enhanced codes may be used for HARQ transmissions from the UE to the base station and/or from the base station to the UE. Although some of features may be described in the context of an UE or a base station, features described above may be implemented at the UE, the base station, or both, for improving decoding performance at the receiver.

Figure 8:
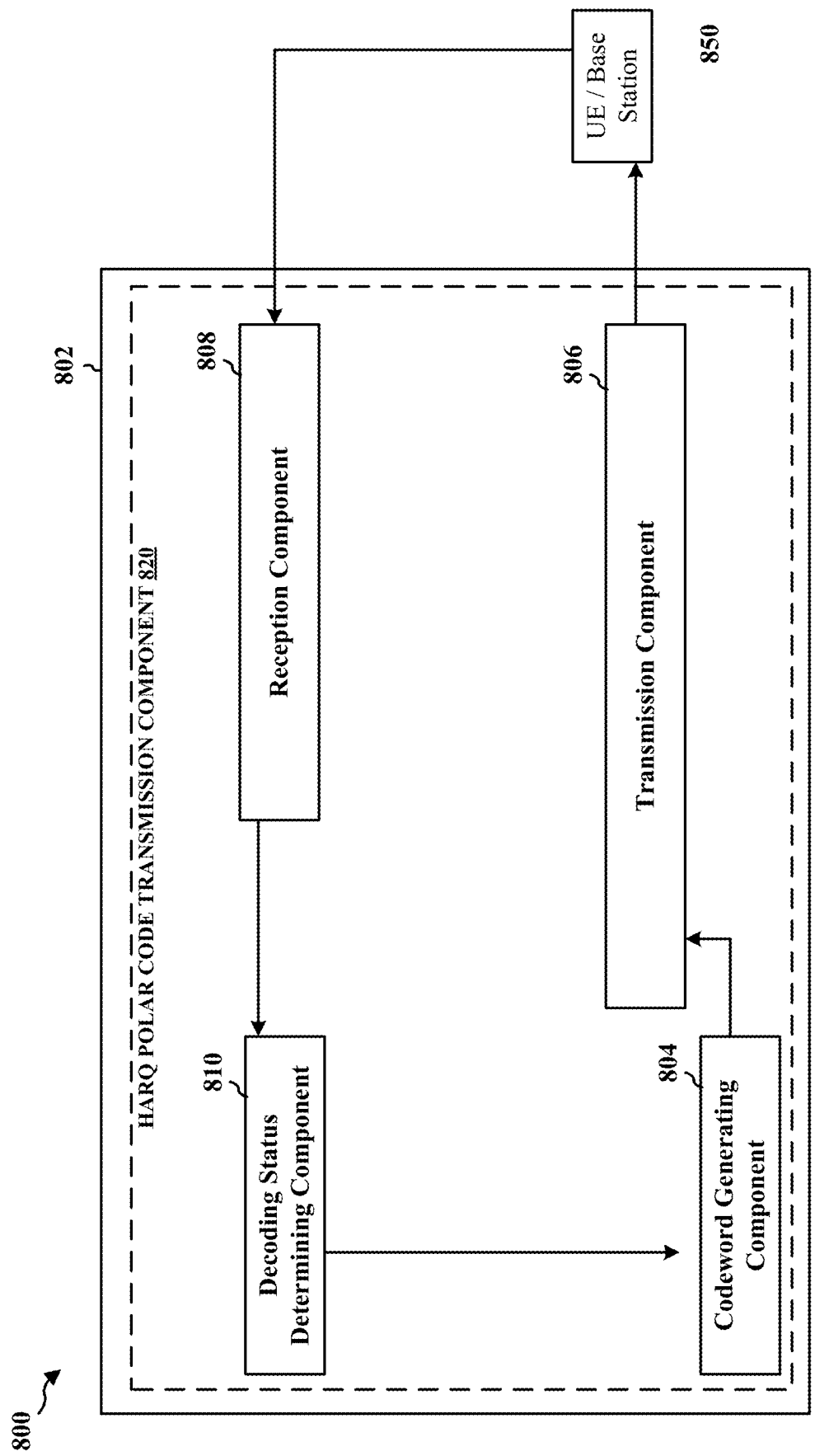
FIG. 8 is a conceptual data flow diagram illustrating the data flow between different means/components in an exemplary apparatus including a HARQ polar code transmission component in accordance with various aspects of the present disclosure.

FIG. 8 is a conceptual data flow diagram 800 illustrating the data flow between different means/components in an exemplary apparatus 802 that includes a HARQ polar code transmission component 820, which may be the same as or similar to HARQ polar code transmission component 420. The apparatus may be a user equipment 850 (UE) which may include UE 104 of FIGS. 1 and 4 and/or a base station 850, which may include base station 102 of FIGS. 1 and 4. The apparatus includes a codeword generating component 804 (same as or similar to codeword generating component 422 of FIG. 4) for generating codewords which may be polar codes or enhanced polar codes, a transmission component 806 (same as or similar to transmitting component 424 of FIG. 1) to transmit the codewords, a receiving component 808 (same as or similar to receiving component 426 of FIG. 1) to receive ACK/NACK messages from the receiver, and/or a decoding status determining component 810 (same as or similar to decoding status determining component 428 of FIG. 1) to determine whether the decoding of a codeword is successful at a receiver.

The apparatus may include additional components that perform each of the blocks of the algorithm in the aforementioned flowcharts of FIG. 7. As such, each block in the aforementioned flowcharts of FIG. 7 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 9:
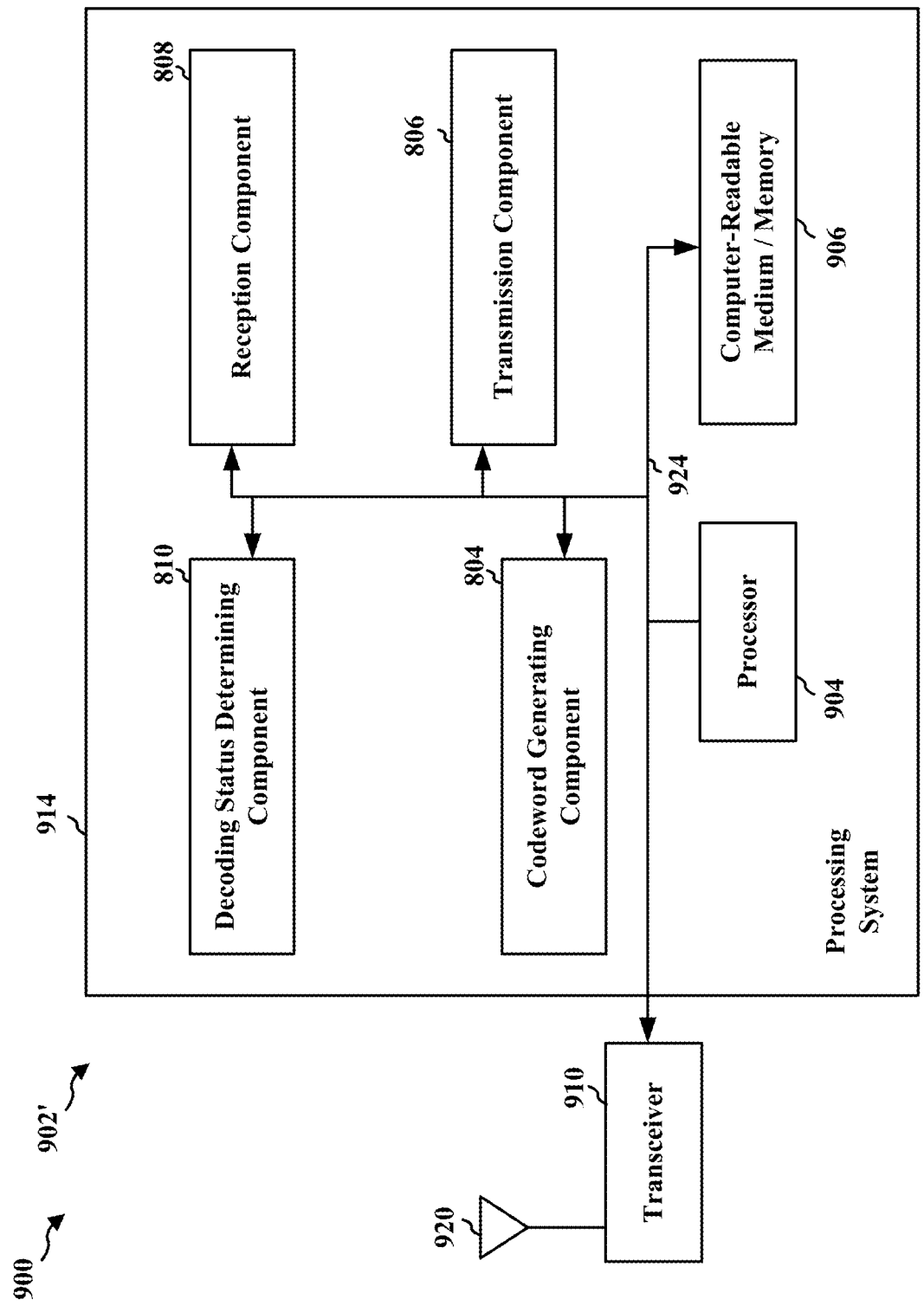
FIG. 9 is a diagram illustrating an example of a hardware implementation for an apparatus employing a processing system including a HARQ polar code transmission component for a HARQ transmission in accordance with various aspects of the present disclosure.

FIG. 9 is a diagram 900 illustrating an example of a hardware implementation for an apparatus 902' employing a processing system 914 that includes a HARQ polar code transmission component 820 (FIG. 8), which may be the same as or similar to HARQ polar code transmission component 420 of FIGS. 1 and 4. The processing system 914 may be implemented with a bus architecture, represented generally by the bus 924. The bus 924 may include any number of interconnecting buses and bridges depending on the specific application of the processing system 914 and the overall design constraints. The bus 924 links together various circuits including one or more processors and/or hardware components, represented by the processor 904, the components 804, 806, 808, and/or 810, and the computer-readable medium/memory 906. The bus 924 may also link various other circuits such as timing sources, peripherals, voltage regulators, and power management circuits, which are well known in the art, and therefore, will not be described any further.

The processing system 914 may be coupled to a transceiver 910. The transceiver 910 is coupled to one or more antennas 920. The transceiver 910 provides a means for communicating with various other apparatus over a transmission medium. The transceiver 910 receives a signal from the one or more antennas 920, extracts information from the received signal, and provides the extracted information to the processing system 914, specifically the reception component 904. In addition, the transceiver 910 receives information from the processing system 914, specifically the transmission component 912, and based on the received information, generates a signal to be applied to the one or more antennas 920. The processing system 914 includes a processor 904 coupled to a computer-readable medium/memory 906. The processor 904 is responsible for general processing, including the execution of software stored on the computer-readable medium/memory 906. The software, when executed by the processor 904, causes the processing system 914 to perform the various functions described supra for any particular apparatus. The computer-readable medium/memory 906 may also be used for storing data that is manipulated by the processor 904 when executing software. The processing system 914 further includes at least one of the components 804, 806, 808, and/or 810. The components may be software components running in the processor 904, resident/stored in the computer readable medium/memory 906, one or more hardware components coupled to the processor 904, or some combination thereof.

In one configuration, the apparatus 902/902' for wireless communication includes means for generating a group of binary data bits for resources of each of the layers; means for mapping each of the groups of binary data bits to a respective code word in a signal constellation, wherein the mapping of each of the groups of binary data bits is based at least on maximizing a distance between the code words within each of the layers; means for combining the code words; and means for transmitting the combined code word. The aforementioned means may be one or more of the aforementioned components of the apparatus 902 and/or the processing system 914 of the apparatus 902' configured to perform the functions recited by the aforementioned means. As described supra, the processing system 914 may include the TX Processor 316, the RX Processor 370, and/or the controller/processor 375. As such, in one configuration, the aforementioned means may be the TX Processor 316, the RX Processor 370, and the controller/processor 375 configured to perform the functions recited by the aforementioned means. In an additional aspect, the processing system 914 may include the TX Processor 368, the RX Processor 356, and/or the controller/processor 359. As such, in another configuration, the aforementioned means may be the TX Processor 368, the RX Processor 356, and the controller/processor 359 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of transmitting using hybrid automatic repeat request (HARQ), comprising:
generating a first codeword for a first information block, wherein the first codeword is a first polar code, and wherein the first information block includes cyclic redundancy check (CRC) bits;
transmitting the first codeword to a receiver;
determining that the first polar code is not successfully decoded at the receiver based at least on a first message received from the receiver;
generating a second codeword for a second information block, wherein the second codeword is a first enhanced polar code, and wherein the second information block does not include any CRC bits;
transmitting the second codeword to the receiver; and
determining that the second codeword and the first codeword are successfully decoded at the receiver based at least on a second message received from the receiver.

2. The method of claim 1, further comprising:
determining that at least one of the second codeword or the first codeword is not successfully decoded at the receiver based at least on the second message received from the receiver;
generating a third codeword for a third information block when the at least one of the second codeword or the first codeword is not successfully decoded at the receiver, wherein the third codeword is a second enhanced polar code, and wherein the third information block includes portions of the first information block and excludes any CRC bits;
transmitting the third codeword to the receiver; and
determining that the third codeword, the second codeword, and the first codeword are successfully decoded at the receiver based at least on a third message received from the receiver.

3. The method of claim 2, further comprising:
determining that at least one of the third codeword, the second codeword, or the first codeword is not successfully decoded at the receiver based at least on the third message received from the receiver;
generating a fourth codeword for a fourth information block when the at least one of the third codeword, the second codeword, or the first codeword is not successfully decoded at the receiver, wherein the fourth codeword is a third enhanced polar code, and wherein the fourth information block includes portions of the first information block and excludes any CRC bits;
transmitting the fourth codeword to the receiver; and
determining that the fourth codeword, the third codeword, second codeword, and the first codeword are successfully decoded at the receiver based at least on a fourth message received from the receiver.

4. The method of claim 3, wherein the first, the second, the third, or the fourth message includes an acknowledgement (ACK) or a negative acknowledgement (NACK) message from the receiver.

5. The method of claim 3, wherein at least one of:
the second codeword is smaller in size than the first codeword,
the third codeword is smaller in size than the second codeword, or
the fourth codeword is smaller in size than the third codeword.

6. The method of claim 5, wherein at least one of:
the second codeword is half in size of the first codeword,
the third codeword is half in size of the second codeword, or
the fourth codeword is half in size of the third codeword.

7. The method of claim 3, wherein the CRC bits are twenty four bits in size.

8. The method of claim 1, wherein the transmitting is from an user equipment (UE) or a base station.

9. The method of claim 1, wherein the receiver is an user equipment (UE) or a base station.

10. An apparatus for transmitting using hybrid automatic repeat request (HARQ), comprising:
    means for generating a first codeword for a first information block, wherein the first codeword is a first polar code, and wherein the first information block includes cyclic redundancy check (CRC) bits;
    means for transmitting the first codeword to a receiver;
    means for determining that the first polar code is not successfully decoded at the receiver based at least on a first message received from the receiver;
    means for generating a second codeword for a second information block, wherein the second codeword is a first enhanced polar code, and wherein the second information block does not include any CRC bits;
    means for transmitting the second codeword to the receiver; and
    means for determining that the second codeword and the first codeword are successfully decoded at the receiver based at least on a second message received from the receiver.

11. The apparatus of claim 10, further comprising:
    means for determining that at least one of the second codeword or the first codeword is not successfully decoded at the receiver based at least on the second message received from the receiver;
    means for generating a third codeword for a third information block when the at least one of the second codeword or the first codeword is not successfully decoded at the receiver, wherein the third codeword is a second enhanced polar code, and wherein the third information block includes portions of the first information block and excludes any CRC bits;
    means for transmitting the third codeword to the receiver; and
    means for determining that the third codeword, the second codeword, and the first codeword are successfully decoded at the receiver based at least on a third message received from the receiver.

12. The apparatus of claim 11, further comprising:
    means for determining that at least one of the third codeword, the second codeword, or the first codeword is not successfully decoded at the receiver based at least on the third message received from the receiver;
    means for generating a fourth codeword for a fourth information block when the at least one of the third codeword, the second codeword, or the first codeword is not successfully decoded at the receiver, wherein the fourth codeword is a third enhanced polar code, and wherein the fourth information block includes portions of the first information block and excludes any CRC bits;
    means for transmitting the fourth codeword to the receiver; and
    means for determining that fourth codeword, the third codeword, second codeword, and the first codeword are successfully decoded at the receiver based at least on a fourth message received from the receiver.

13. The apparatus of claim 12, wherein the first, the second, the third, or the fourth message includes an acknowledgement (ACK) or a negative acknowledgement (NACK) message from the receiver.

14. The apparatus of claim 12, wherein at least one of:
    the second codeword is smaller in size than the first codeword,
    the third codeword is smaller in size than the second codeword, or
    the fourth codeword is smaller in size than the third codeword.

15. The apparatus of claim 14, wherein at least one of:
    the second codeword is half in size of the first codeword,
    the third codeword is half in size of the second codeword, or
    the fourth codeword is half in size of the third codeword.

16. The apparatus of claim 10, wherein the apparatus comprises an user equipment (UE) or a base station and the receiver comprises an user equipment (UE) or a base station.

17. An apparatus for transmitting using hybrid automatic repeat request (HARQ), comprising:
    a memory; and
    at least one processor coupled to the memory and configured to:
        generate a first codeword for a first information block, wherein the first codeword is a first polar code, and wherein the first information block includes cyclic redundancy check (CRC) bits;
        transmit the first codeword to a receiver;
        determine that the first polar code is not successfully decoded at the receiver based at least on a first message received from the receiver;
        generate a second codeword for a second information block, wherein the second codeword is a first enhanced polar code, and wherein the second information block does not include any CRC bits;
        transmit the second codeword to the receiver; and
        determine that the second codeword and the first codeword are successfully decoded at the receiver based at least on a second message received from the receiver.

18. The apparatus of claim 17, wherein the at least one processor is further configured to:
    determine that at least one of the second codeword or the first codeword is not successfully decoded at the receiver based at least on the second message received from the receiver;
    generate a third codeword for a third information block when the at least one of the second codeword or the first codeword is not successfully decoded at the receiver, wherein the third codeword is a second enhanced polar code, and wherein the third information block includes portions of the first information block and excludes any CRC bits;
    transmit the third codeword to the receiver; and
    determine that the third codeword, the second codeword, and the first codeword are successfully decoded at the receiver based at least on a third message received from the receiver.

19. The apparatus of claim 18, wherein the at least one processor is further configured to:
    determine that at least one of the third codeword, the second codeword, or the first codeword is not successfully decoded at the receiver based at least on the third message received from the receiver;
    generate a fourth codeword for a fourth information block when the at least one of the third codeword, the second codeword, or the first codeword is not successfully decoded at the receiver, wherein the fourth codeword is a third enhanced polar code, and wherein the fourth information block includes portions of the first information block and excludes any CRC bits;

transmit the fourth codeword to the receiver; and determine that fourth codeword, the third codeword, second codeword, and the first codeword are successfully decoded at the receiver based at least on a fourth message received from the receiver.

20. The apparatus of claim 19, wherein the first, the second, the third, or the fourth messages include an acknowledgement (ACK) or a negative acknowledgement (NACK) message from the receiver.

21. The apparatus of claim 19, wherein at least one of:
the second codeword is smaller in size than the first codeword,
the third codeword is smaller in size than the second codeword, or
the fourth codeword is smaller in size than the third codeword.

22. The apparatus of claim 21, wherein at least one of:
the second codeword is half in size of the first codeword,
the third codeword is half in size of the second codeword, or
the fourth codeword is half in size of the third codeword.

23. The apparatus of claim 17, wherein the apparatus comprises an user equipment (UE) or a base station and the receiver comprises an user equipment (UE) or a base station.

24. A non-transitory, computer-readable medium storing computer-executable code for transmitting using hybrid automatic repeat request (HARQ), the code when executed by at least one processor cause the at least one processor to:
generate a first codeword for a first information block, wherein the first codeword is a first polar code, and wherein the first information block includes cyclic redundancy check (CRC) bits;
transmit the first codeword to a receiver;
determine that the first polar code is not successfully decoded at the receiver based at least on a first message received from the receiver;
generate a second codeword for a second information block, wherein the second codeword is a first enhanced polar code, and wherein the second information block does not include any CRC bits;
transmit the second codeword to the receiver; and
determine that the second codeword and the first codeword are successfully decoded at the receiver based at least on a second message received from the receiver.

25. The non-transitory, computer-readable medium of claim 24, the code when executed by the at least one processor further cause the at least one processor to:
determine that at least one of the second codeword or the first codeword is not successfully decoded at the receiver based at least on the second message received from the receiver;
generate a third codeword for a third information block when the at least one of the second codeword or the first codeword is not successfully decoded at the receiver, wherein the third codeword is a second enhanced polar code, and wherein the third information block includes portions of the first information block and excludes any CRC bits;
transmit the third codeword to the receiver; and
determine that the third codeword, the second codeword, and the first codeword are successfully decoded at the receiver based at least on a third message received from the receiver.

26. The non-transitory, computer-readable medium of claim 25, the code when executed by the at least one processor further cause the at least one processor to:
determine that at least one of the third codeword, the second codeword, or the first codeword is not successfully decoded at the receiver based at least on the third message received from the receiver;
generate a fourth codeword for a fourth information block when the at least one of the third codeword, the second codeword, or the first codeword is not successfully decoded at the receiver, wherein the fourth codeword is a third enhanced polar code, and wherein the fourth information block includes portions of the first information block and excludes any CRC bits;
transmit the fourth codeword to the receiver; and
determine that fourth codeword, the third codeword, second codeword, and the first codeword are successfully decoded at the receiver based at least on a fourth message received from the receiver.

27. The non-transitory, computer-readable medium of claim 26,
wherein the first, the second, the third, or the fourth message includes an acknowledgement (ACK) or a negative acknowledgement (NACK) message from the receiver.

28. The non-transitory, computer-readable medium of claim 26, wherein at least one of:
the second codeword is smaller in size than the first codeword,
the third codeword is smaller in size than the second codeword, or
the fourth codeword is smaller in size than the third codeword.

29. The non-transitory, computer-readable medium of claim 28, wherein at least one of:
the second codeword is half in size of the first codeword,
the third codeword is half in size of the second codeword, or
the fourth codeword is half in size of the third codeword.

30. The computer-readable medium of claim 24, wherein the transmission of the first codeword and the transmission of the second codeword are from an user equipment (UE) or a base station and the receiver is an user equipment (UE) or a base station.

* * * * *